United States Patent
Keil et al.

(10) Patent No.: US 6,679,307 B2
(45) Date of Patent: Jan. 20, 2004

(54) CONVEYORIZED VACUUM APPLICATOR AND METHOD OF APPLYING A DRY FILM RESIST TO A PRINTED CIRCUIT BOARD

(75) Inventors: Charles R. Keil, Foothill Ranch, CA (US); Osvaldo Novello, Albazzate (IT)

(73) Assignee: Shipley Company, L.L.C., Marlborough, MA (US)

( * ) Notice: Subject to any disclaimer, the term of this patent is extended or adjusted under 35 U.S.C. 154(b) by 0 days.

(21) Appl. No.: 10/190,384

(22) Filed: Jul. 3, 2002

(65) Prior Publication Data

US 2003/0051790 A1 Mar. 20, 2003

Related U.S. Application Data

(62) Division of application No. 09/648,445, filed on Aug. 25, 2000, now Pat. No. 6,585,837.

(30) Foreign Application Priority Data

Aug. 25, 1999 (IT) .......................................... MI99A1834

(51) Int. Cl.[7] ............................................... B32B 31/00
(52) U.S. Cl. ....................... 156/351; 156/358; 156/359; 156/361; 156/367; 156/368
(58) Field of Search .......................... 156/64, 230, 285, 156/286, 297, 299, 583.3, 583.5, 583.8, 367, 368, 382, 538, 539, 361, 358, 359, 351; 198/956, 952; 100/151, 154, 222

(56) References Cited

U.S. PATENT DOCUMENTS

| | | |
|---|---|---|
| 3,850,213 A | 11/1974 | Keaton |
| 4,889,790 A | 12/1989 | Roos et al. |
| 4,946,524 A | 8/1990 | Stumpf et al. |
| 4,992,354 A | 2/1991 | Axon et al. |
| 5,164,284 A | 11/1992 | Briguglio et al. |
| 5,292,388 A | 3/1994 | Candore |
| 5,593,532 A | 1/1997 | Falk et al. |

Primary Examiner—Richard Crispino
Assistant Examiner—George R. Koch, III
(74) Attorney, Agent, or Firm—John J. Piskorski

(57) ABSTRACT

An improved method of and apparatus that is continuously automatically operative in an in-line system is described for applying under heat, vacuum and mechanical pressure a dry film photoresist-forming layer to printed circuit boards (136) that already have been prelaminated by the loose application thereto of the dry film resist as discrete cut sheets within the confines of the surface of the boards whereby a laminate without entrapped air bubbles and closely conforming to the raised circuit traces and irregular surface contours of the printed circuit board is obtained. Featured is a conveyorized vacuum laminator (18) comprising heated upper and lower platens (96,94) adapted to be moved into sealing engagement to form a vacuum lamination chamber (16), and disposed between the platens are two independent belt conveyor systems (20,22) that act as heat shields to prevent the printed circuit board and the loosely applied dry film from being heated up too rapidly in the vacuum chamber by the residual heat given off by the upper and lower platens before the film can be completely evacuated. This prevents premature tacking of the dry film to the board and enables all of the air entrapped between the film and the board surface to be drawn off before the application of heat and mechanical pressure, so as to ensure complete conformance of the dry film around the circuit traces and surface contours.

11 Claims, 6 Drawing Sheets

CONVEYORIZED VACUUM APPLICATOR AND METHOD OF APPLYING A DRY FILM RESIST TO A PRINTED CIRCUIT BOARD

This application is a divisional of application Ser. No. 09/648,445 filed on Aug. 25, 2000, now U.S. Pat. No. 6,585,837.

The present invention is directed to an automatic conveyorized vacuum applicator and method of operation thereof having utility in the application of dry film photoresist-forming materials, such as photoresists and solder masks, to surfaces of printed circuit boards or other substrates, to ensure complete conformity of the dry films around raised circuit traces and irregular surface contours. The applicator and method have particular utility for conveying and for applying vacuum, heat, and mechanical pressure to printed circuit boards or other substrates that prior to such application have had dry film loosely applied to at least one of the surfaces thereof as discrete cut sheets within the confines of the substrate.

Primary imaging photoresists and secondary imaging solder masks are among the most widely used photoimageable materials in the manufacture of printed circuit boards. A primary imaging photoresist is used in the creation of the printed circuitry itself, whereas a solder mask is used to protect the printed circuitry during soldering of components onto the board.

A primary photoresist is a hard, temporary layer of non-conductive material which covers the metal surface of a copper-clad substrate that later becomes the printed circuit board. The photoresist is patterned in such a way so as to produce a resist stencil around which the printed circuit tracks are formed.

More specifically, primary photoresists, typically, are formed from a layer of photoimageable composition which is applied to the surface of a copper-clad board. The photoimageable composition is exposed to actinic radiation which is patterned by means of a template or artwork. Subsequent to exposure, the photoimageable layer is developed in an organic solvent, aqueous, or semi-aqueous solution which washes away either exposed or unexposed portions of the layer (depending on whether the photoimageable material is positive-acting or negative-acting). Thereafter, the circuit traces are formed by either electroplating or etching. In a typical plating procedure, the areas devoid of photoresist that become the circuitry are built up from the board surface by electroplating copper thereon. After protecting the electroplated copper layer, the remaining photoresist is stripped away in an organic solvent, aqueous, or semi-aqueous solution, and the newly exposed areas of metal are then selectively removed in an etching solution, leaving behind the pattern plated copper circuit lines. In a typical etching procedure, the metal in the areas devoid of photoresist is selectively removed in an etching solution, leaving behind the residual portions of the etched metal layer as the circuit traces after the primary resist is stripped away.

A solder mask, on the other hand, is a hard, permanent layer of non-conductive material which covers the surface of a printed circuit board or other substrate, encapsulating the traces of the printed circuitry itself. The solder mask is patterned to fully cover the circuitry, except for those portions intended to be exposed, e.g., for soldering to another component.

More specifically, solder masks, typically, are formed from a layer of photoimageable composition which is applied to a surface of the printed circuit board. Similar to primary imaging resists, the photoimageable layer is exposed to actinic radiation which is patterned by means of a template or artwork. Subsequent to exposure, the photoimageable layer is developed in an organic solvent, aqueous, or semi-aqueous solution which washes away either exposed or unexposed portions of the layer (again depending upon whether the photoimageable material is positive-acting or negative-acting). The portion of the layer which remains on the surface is then cured, e.g., with heat and/or UV light, to form a hard, permanent solder mask intended to protect the printed circuitry for the life of the board.

One prior art method of applying a layer of primary resist or solder mask to a circuit board surface is to apply the material in liquid form, and then, either allow it to dry or partially cure the material to form a semi-stable layer. There are a number of advantages, however, to applying a photoimageable layer to a circuit board as a dry film rather than as a liquid. In particular, dry films are free of organic solvent and therefore eliminate this hazard from the workplace and eliminate the need for apparatus to protect the immediate work environment and the more general environment from organic solvent emissions.

Typically, such a dry film comprises a cover sheet of support material which is somewhat flexible but which has sufficient rigidity to provide structure to a layer of photoimageable composition which overlies one surface of the cover sheet. The cover sheet may be formed of polyester material, such a polyethylene terephthalate (PET). To protect the photoimageable layer and to enable the dry film to be rolled, it is conventional for the exposed surface of the photoimageable layer to be covered with a removable protective sheet, e.g., a sheet of polyethylene.

The method of use of such a dry film is generally as follows. The protective polyethylene sheet is removed from the photoimageable composition layer immediately prior to application of the dry film to the surface of the printed circuit board. This may be accomplished, for example, using automated apparatus which peels away and rolls up the protective sheet as the dry film is unrolled from a reel. The dry film is applied to the surface of the circuit board with the photoimageable layer in direct contact with the board surface. Then using either heat and mechanical pressure (in the case of roll laminators) or a combination of vacuum, heat, and mechanical pressure (in the case of vacuum laminators), the photoimageable layer is immediately laminated to the surface of the board. The cover sheet remains overlying the photoimageable layer, protecting the photoimageable layer from exposure to oxygen and from handling damage. The cover sheet also permits a pattern (or template) to be laid directly on top of the dry film for contact printing, if contact printing is to be used (as is usually preferred from the standpoint of obtaining optimal image resolution). The dry film is exposed to patterned actinic radiation through the PET cover sheet. At this time, the PET cover sheet is removed, permitting access to the exposed photoimageable layer by developer. Depending upon the composition of the photoimageable layer, the photoimageable layer is developed with organic solvent, aqueous developer, or semi-aqueous developer. The photoimageable layer may either be positive-acting, in which case the exposed portions are removed by developer, or negative-acting, in which case the unexposed portions are removed by developer. Most photoimageable layers for preparing primary imaging photoresists and solder masks are negative-acting. Subsequent to development, primary resists, in particular, are subjected to either electroplating or etching, as previously described, to form the circuit traces after which the remaining photoresist is stripped away with organic solvent, aqueous stripper, or semi-aqueous stripper. Whereas, in the case of solder masks which remain on the board permanently, most photoimageable composition layers require some cure subsequent to development to render the layer hard and permanent so as to serve as a solder mask. Depending upon the composition of the photoimageable layer, curing may be effected with heat and/or UV light.

Printed circuit boards almost invariably have uneven surfaces which present difficulties for dry film application. During solder mask application, in particular, such unevenness is usually attributed to the circuitry traces which are raised or elevated over the surface of the board of electrically non-conducting material. It is therefore desirable that any dry film solder mask applied to the board be able to conform around the upstanding circuitry traces to minimize the risk of defects, such as short circuits. On the other hand, during primary resist application, such unevenness usually arises when creating circuitry on thin outer surfaces of multi-layered circuit boards which contain embedded components that protrude and leave impressions on the outer surface. It is desirable that any photoresist applied to such a board be able to conform to such irregular surface contours to minimize the formation of defects, such as voids, disconnects, or shorts. There has also been a demand on circuit board manufactures, due to the current trend to miniaturize electronic equipment, to reduce the size of printed circuit boards while increasing their functional capabilities which presents other difficulties for dry film photoresist application. As more circuitry needs to be fit onto smaller surfaces, the circuit lines and spaces therebetween on the circuit board have continued to shrink. The creation of this fine line and closely spaced circuitry can be achieved only with difficulty and only if the primary resist fully adheres and completely conforms to the contours of the printed circuit board. Otherwise, voiding of the minute circuit traces and creation of disconnects or shorts will occur.

A number of improved photoimageable dry films and vacuum lamination processes have been developed to try to improve the conformance of the dry film to the irregular surface contours of a printed circuit board, as for example, as disclosed in U.S. Pat. No. 4,889,790 (Roos et al.), U.S. Pat. No. 4,992,354 (Axon et al.), and U.S. Pat. No. 5,164,284 (Briguglio et al.), The processes disclosed in these patents involve applying a photoresist-forming layer to a printed circuit board using a dry film in which an "intermediate layer" selected for its transparency, strength and flexibility is interposed between the support film or cover sheet and the photoimageable layer. The intermediate layer of the dry film is selectively more adherent to the photoimageable composition layer than to the cover sheet, allowing the cover sheet to be removed after the photoimageable layer is laminated to a printed circuit board to assist conformance, with the intermediate layer remaining on the photoimageable composition layer as a "top coat." The top coat is of non-tacky material and can be placed in contact with other surfaces, such as artwork for contact printing. The top coat also serves as an oxygen barrier, allowing the photoimageable composition layer to remain unexposed on the printed circuit board, after cover sheet removal, for some length of time. The use of dry film having the "intermediate layer" or "top coat" make possible the processes described in these patents.

In each case, to form a more conforming dry film, the protective polyethylene sheet is first peeled away and the exposed surface of the photoimageable composition layer is applied to the surface of the printed circuit board. Using vacuum, heat and mechanical pressure, the dry film is laminated to the surface of the printed circuit board, partially conforming the photoimageable layer thereto. Within about 60 seconds and before substantial cooling of the printed circuit board and dry film has occurred, the cover sheet of the dry film is removed, whereupon the photoimageable composition layer and overlying top coat fully conform to the contours of the printed circuit board and substantially encapsulate the traces and surface contours before conventional processing. Because the cover sheet is removed prior to the final conforming step, better conformance, particularly when applying thin photoimageable composition layers onto boards with closely spaced traces, is achieved. Better resolution is also achievable because the top coat may be directly contacted with artwork for contact printing and because the top coat is much thinner than a cover sheet or support film and is, therefore, much less a deterrent to good resolution than a support film.

In U.S. Pat. No. 4,946,524 (Stumpf et al.), there is disclosed an applicator and process for applying a conforming dry film material to the surface of a printed circuit board allowing for, at the same time, the removal of the protective sheet, subsequent handling of the board with the applied film, and the draw-off of air enclosed between the film and the board. The draw-off of air enclosed between the dry film and the surface of the printed circuit board is facilitated when, before vacuum lamination, the surface of the board is covered with a loose sheet of film. To that end the applicator of U.S. Pat. No. 4,946,524 is operative to tack the dry film to a board at the leading and trailing edges with the intermediate portion of the film loosely applied thereto. The film is tacked to the board as a discrete cut sheet within the confines of the perimeter of the surface of the board. For convenience, a printed circuit board having such loose application of a dry film sheet to the surface or surfaces thereof is referred to hereinafter as being "prelaminated."

In order to adapt the processes described in the preceding patents for continuous automatic operation in an in-line system, there is disclosed in U.S. Pat. No. 5,292,388 (Candore) an automatic conveyorized vacuum laminator apparatus. The apparatus of U.S. Pat. No. 5,292,388 provides an improved and efficient means for automatically conveying and applying vacuum, heat, and mechanical pressure to prelaminated printed circuit boards or substrates and overcomes the difficulties encountered with the utilization of a conventional batch vacuum laminator in an automated in-line system. The automatic conveyorized vacuum laminator is comprised of two main parts, a vacuum laminator and an input roll conveyor for feeding prelaminated circuit boards into the vacuum laminator from the preceding prelaminating equipment. The vacuum laminator, in particular, comprises a vacuum chamber defined by heated upper and lower platens, and an endless belt conveyor disposed between the platens for movement of the printed circuit boards into and out of the vacuum chamber region. The endless belt conveyor, in particular, comprises an endless belt having one section upon which the board can be placed and an aperture therein such that, as the board is moved on the endless belt conveyor into the region of the first vacuum chamber between the upper and lower platens, the aperture is moved into vertical alignment with the lower platen. In operation, the prelaminated circuit board (i.e., having the dry film photoimageable material loosely applied to its surface) to be vacuum laminated is transferred from the input roll conveyor to the endless belt conveyor which moves the board into proper vacuum lamination position between the heated upper and lower platens. Thereafter, the lower platen is raised up through the aperture in the endless belt into sealing engagement with the upper platen in order to capture in the vacuum chamber both the belt and the prelaminated board then resting on the surface of the belt. Next, a vacuum is drawn in the vacuum chamber between the platens to evacuate all air between the dry film and surface of the prelaminated board, followed by application of heat and mechanical pressure to conform the dry film to the board. When the cycle is complete, the lower platen is lowered and the laminated board in conveyed away by the belt conveyor to subsequent processing equipment and the endless belt is returned to its initial position, while the next board to be vacuum laminated arrives for the next vacuum lamination cycle.

Difficulty has been encountered, however, with the operation of the conveyorized vacuum lamination apparatus, as described in U.S. Pat. No. 5,292,388. Particularly, premature tacking of the dry film to the board surface prior to chamber evacuation has been a problem. The problem is particularly prevalent with thin boards (e.g. <0.25 mm.), since they are susceptible to rapid heating. In order to assure complete conformance of the dry film around the circuit traces and substrate surface contours, it is necessary that the loose sheet of dry film prelaminated to the board allow for all air enclosed between it and surface of the printed circuit board to be evacuated before applying heat and mechanical pressure to conform the film to the board. Yet, with the above apparatus, the residual heat given off by the endless belt of the endless belt conveyor just after having completed a prior vacuum lamination cycle has a tendency to cause premature tacking of the film on the next board entering into the vacuum chamber prior to commencement of the vacuum lamination cycle. Premature adhesion prevents air from escaping from certain areas along the film during vacuum lamination, which, in turn, prevents film conformance. In the case of solder masks, lack of film conformance results in lamination defects, such as unwanted puddling caused by premature adhesion. In the case of primary resists, lack of film conformance tends to result in voiding of entire portions of the circuit traces caused by incomplete adhesion, as well as puddling as previously described. The present invention was devised to address this problem.

While there has been some attempt to address this premature tacking problem, a satisfactory answer has yet to be devised. For instance, it has been proposed to process the dry films in conventional batch-oriented vacuum laminating equipment outfitted with removable copper heat shields between the upper and lower platens. The removable heat shields are manually inserted between the upper and lower platens immediately before placement of the board in the vacuum chamber. Evacuation is then commenced with the heat shields serving to insulate the resist from elevated temperatures long enough to be able to remove all of the air between the resist and the board before application of heat and mechanical pressure. However, batchwise processing is highly undesirable because it is entirely too slow for mass production of printed circuit boards and extremely labor intensive.

An object of the invention is, therefore, to provide an improved method of and apparatus for applying under vacuum, heat and mechanical pressure a dry film photoresist or solder mask to prelaminated printed circuit boards or other substrates, thereby to remove all of the air entrapped between the dry film and the surface of the printed circuit board or substrate to assure complete conformance of the dry film around the raised circuit traces and the substrate surface contours.

Another object of the invention is to provide an improved method of and apparatus for vacuum laminating prelaminated printed circuit boards and substrates, which method and apparatus prevent premature tacking of the loosely applied prelaminated dry film to the surface of the printed circuit board or substrate prior to evacuation of all of the air between the dry film and the board or substrate surface.

Still another object of the invention is to provide an improved method of and apparatus for vacuum laminating prelaminated printed circuit boards and substrates which are both operable in an in-line system and in a fully automated continuous manner.

In accomplishing the forgoing and other objectives of the invention, there is provided an improved method of laminating a prelaminated printed circuit board or other substrate which prevents premature tacking of the dry film photoresist-forming layer to the board comprising the following key features: (a) placing a prelaminated board or substrate on one section of a lower moving belt conveyor for movement into a vacuum chamber region of a dual belt vacuum laminator for the application of vacuum, heat and mechanical pressure thereto, the lower belt conveyor being characterized in the use of an endless belt having two distinct sections upon which the board can be placed, the two sections being so positioned such that, when one section of the lower belt conveyor is moved with the board into the vacuum chamber region, the other section is moved out of said region for cooling and vice versa; (b) indexing a section of an upper belt conveyor spaced above said lower belt conveyor into the vacuum chamber region, the upper belt conveyor being characterized in the use of an endless belt having at least two distinct sections, the at least two sections being so positioned such that, when one section of the upper belt is moved into the vacuum chamber region, at least one other section is moved out of said region for cooling and vice versa; (c) stopping the movement of the lower belt conveyor once the board is moved into proper position in the vacuum chamber of the vacuum laminator; (d) drawing a vacuum in the vacuum chamber for a time sufficient to evacuate substantially all of the air from between the dry film and the surface of the board or substrate and to place the dry film in intimate contact with the surface of the board or substrate, followed by application of sufficient heat to cause the dry film to flow and sufficient mechanical pressure on the board or substrate to thereby force the heated laminate to conform closely to the surface contours of the board or substrate; and, (e) after the vacuum lamination process is complete, conveying the processed board or substrate off of the hot belt section of the lower belt conveyor while loading a new prelaminated board on the other section of the lower belt conveyor which has been allowed to cool outside the vacuum laminator during the previous lamination cycle; (f) and repeating steps (a) through (e) with a new prelaminated board.

The aforesaid steps enable the board being vacuum laminated to be initially disposed in the vacuum chamber only between cool sections of the upper and lower belts. Since the upper and lower belt sections in the chamber are cold, they act as heat shields to prevent the dry film from heating up too fast and prematurely adhering to the board, when exposed to residual heat given off by the vacuum laminator which is still hot from a previous vacuum lamination cycle, before the film can be completely evacuated of entrapped air.

The aforesaid steps are preferably performed in-line and in a continuous automated manner, so that the method can be adapted for use in an fully automated in-line system for manufacturing printed circuit boards.

In accomplishing these and other objectives of the invention, there is also provided an improved dry film photoresist or solder mask vacuum lamination apparatus comprising the following key features: the provision of a vacuum laminator having two independent (i.e., dual) belt conveyor systems associated therewith, specially a lower belt conveyor and an upper belt conveyor; the lower belt conveyor being operatively positioned for movement of the prelaminated board or substrate into and out of the vacuum laminator for application of vacuum, heat and mechanical pressure to the board and being characterized in its use of an endless belt having two distinct sections upon which the board can be placed, the two sections being so positioned such that, when one section of the lower belt is moved into the vacuum chamber region of the vacuum laminator, the other section is moved out of said region and vice versa, and the upper belt conveyor being spaced above said lower belt conveyor in the vacuum region of the vacuum laminator, and, the upper belt conveyor being characterized in its use of an endless belt having at least two distinct sections that alternate into and out of the vacuum chamber region of said vacuum laminator such that, when one section of the upper belt is moved into the vacuum chamber region, at least one other section is moved out of said region and vice versa; such that in operation as one section of the lower belt upon which the board or substrate to be vacuum laminated is placed is moved into the vacuum chamber region of the vacuum laminator, one section of the upper belt is moved into the vacuum chamber region, and the other sections of the lower and upper belts are moved out of the vacuum chamber for cooling and vice versa.

The aforesaid apparatus is preferably further characterized by the capacity thereof for automated continuous operation. It is also preferable to provide such a continuously operative conveyorized vacuum applicator that is operative, in association with an automated input roll conveyors for feeding prelaminated printed circuit boards or substrates onto the automated conveyor belts, in such a way as to allow at least one board or substrate to be in the vacuum laminator, while the next board or substrate to be vacuum laminated is staged in position on an input roll conveyor ready for the next vacuum lamination cycle to begin. Upon completion of the vacuum lamination cycle, the printed circuit board is automatically conveyed out of the vacuum laminator, and the staged new printed circuit board to be vacuum laminated is conveyed into the first vacuum chamber.

The automatic conveyorized vacuum applicator has particular utility in conveying printed circuit boards and applying vacuum, heat and mechanical pressure to printed circuit boards that have been prelaminated with photoresist or solder mask dry film in accordance with the process described in U.S. Pat. No. 4,946,524 and fabricated in accordance with processes described in U.S. Pat. Nos. 4,889,790, 4,992,354, and 5,164,284.

The conveyorized dry film photoresist or solder mask applicator of the invention is an important component in the total arrangement of an automatic continuous flow of material in in-line processing of dry photoresist or solder mask films requiring vacuum lamination during processing.

The invention provides the means to automate the vacuum application process as an in-line system, while at the same time 1) reducing common lamination defects, such as premature resist adhesion, and 2) substantially eliminating the need to repair or rework finished printed circuit boards.

With this description of the invention, a detailed description follows with reference being made to the accompanying figures of drawing which form part of the specification in which like parts are designated by the same reference numbers and of which:

Figure 1:
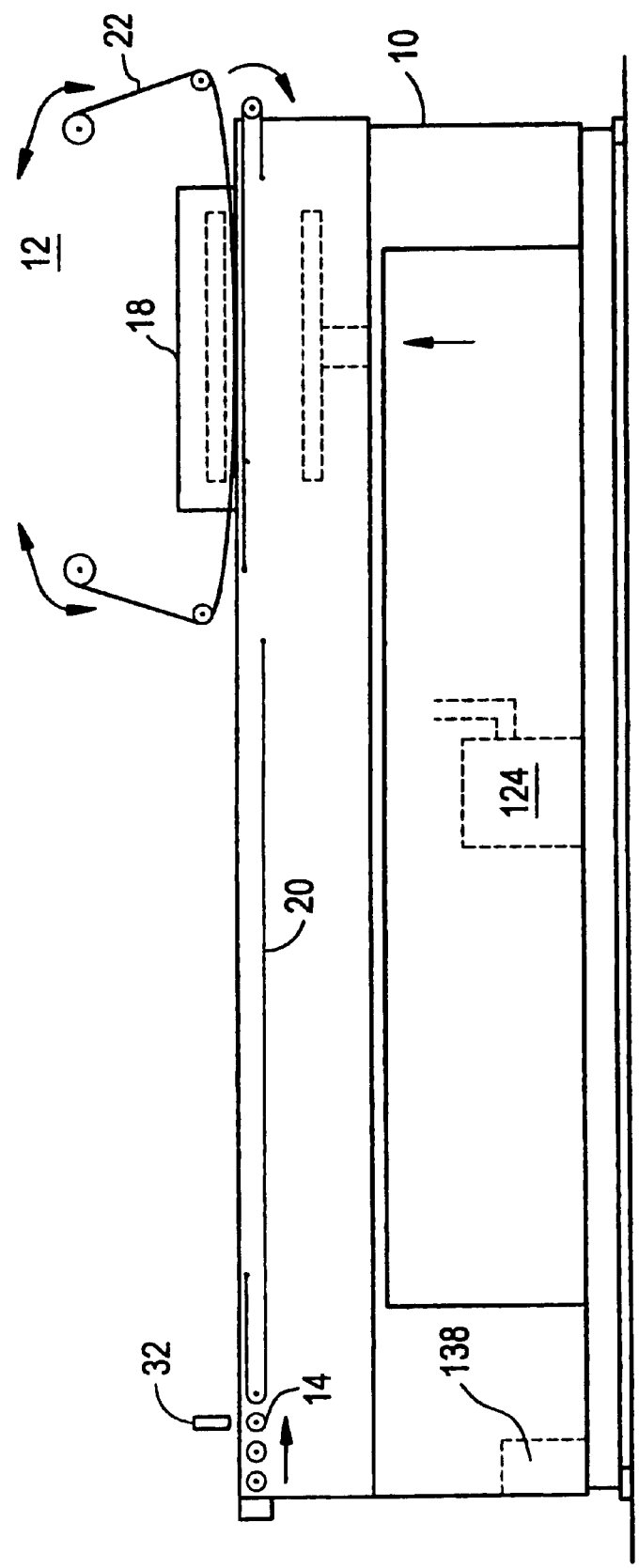
FIG. 1 is a side view of a cabinet structure in which the conveyorized dual belt vacuum applicator of the present invention is housed.
Figure 2:
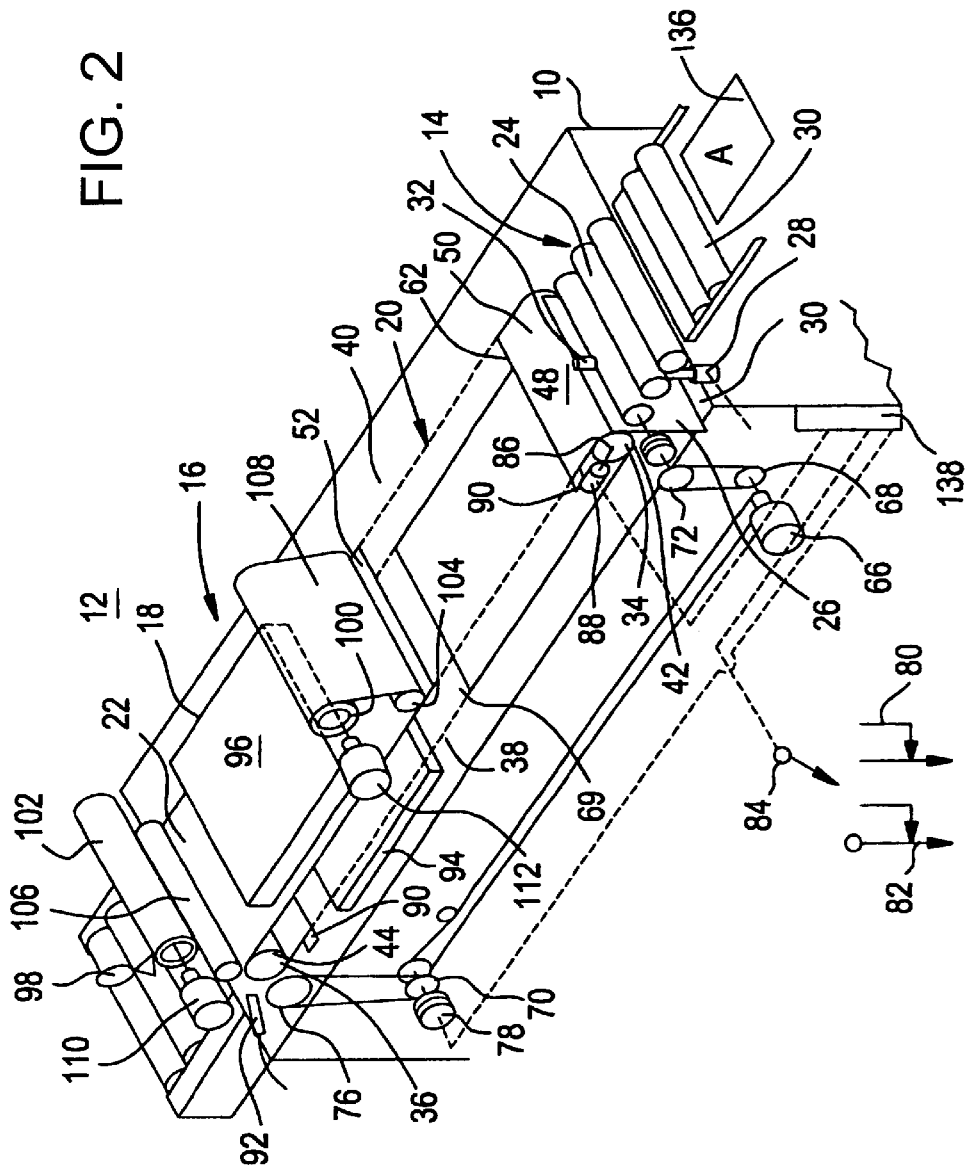
FIG. 2 is a diagrammatic perspective view on a scale larger than of FIG. 1 illustrating the dual belt conveyor system of the conveyorized vacuum applicator in accordance with the present invention.

FIGS. 4–7 are cross sectional views of a vacuum laminator that advantageously may be used with the conveyorized vacuum applicator and which illustrate a platen operation sequence thereof; and, FIGS. 8–13 are diagrammatic perspective views that illustrate the function cycle of the conveyorized vacuum applicator of FIGS. 1 and 2 when employed to feed printed circuit boards or substrates one at a time through the vacuum laminator.

The conveyorized vacuum applicator according to the present invention has particular utility in the vacuum lamination of printed circuit boards and substrates of varying thicknesses and sizes, typically in a range from between 0.1 and 3.2 mm. and in a range from between 25×38 and 60×71 cm., which boards or substrates have been "prelaminated" with a loose sheet of dry film primary photoresist or solder mask, with or without a "top coat" layer, as hereinbefore described. The specific function of the conveyorized vacuum applicator is to automatically apply a combination of vacuum, heat, and mechanical pressure, in that order, to completely remove all of the air between the dry film and the surface of the board or substrate and to assure positive conformance of the dry film around etched or electroplated circuit traces and irregular substrate surface contours.

Referring now to FIGS. 1–2, there is shown a support structure or frame 10 on which is mounted the conveyorized vacuum applicator, designated 12, according to the invention. The conveyorized vacuum applicator 12 is comprised of an input or feed conveyor 14 and a vacuum section 16 which includes a vacuum laminator 18 and two independent belt conveyors, specifically a lower belt conveyor 20 and an upper belt conveyor 22.

As shown in FIG. 2, the input conveyor 14 and the lower belt conveyor 20 extend in end-to-end relation, in that order, to define a continuous path for movement of a board to be laminated into and out of the vacuum section 16 of the conveyorized vacuum applicator 12.

The input conveyor 14, in particular, comprises a plurality of chain coupled rolls 24 that extend for a substantial distance across the width of the applicator 12. Positioned for vertical movement between the exit end of the input conveyor 14 and entrance end of the lower belt conveyor is an adjustable barrier 26.

The barrier 26 extends across the width of the applicator 12 and is movable upwardly by an individually associated air cylinder 28, as shown in FIG. 2. Such movement is from a "down" or non-blocking position to an "up" position to block the transport to the next succeeding conveyor of a printed circuit board being transported on the input conveyor 14 from preceding equipment indicated at 30.

As seen in FIG. 2, a photocell 32 is provided for sensing the approach of a printed circuit board to the exit end of the input conveyor 14 and for initiating the actuation of individually associated air cylinder 28 for effecting the movement of the barrier 26 between the printed circuit board non-blocking and blocking positions thereof.

Figure 3:
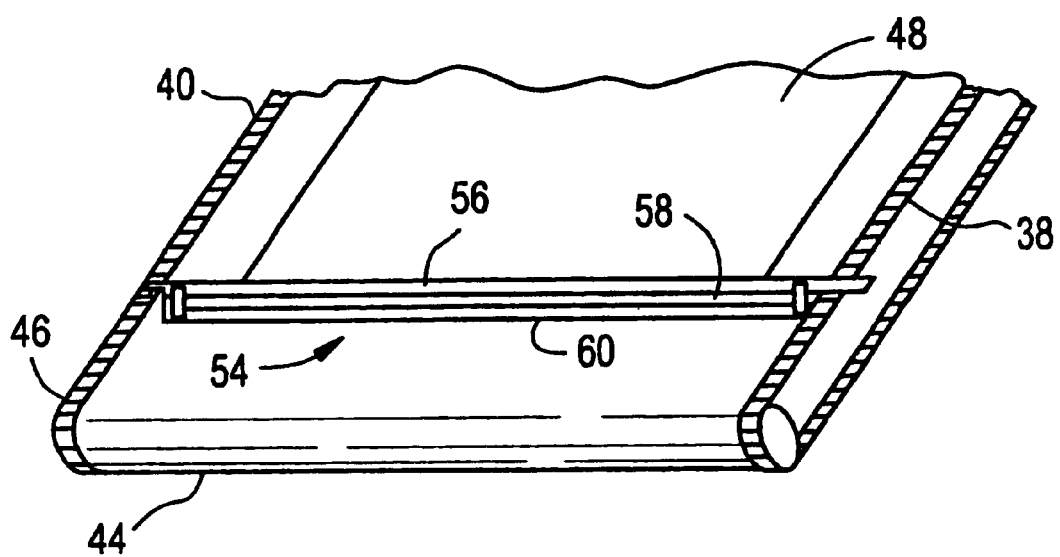
FIG. 3 is a fragmented detail view of the lower belt conveyor of the applicator of FIGS. 1 and 2.

The lower belt conveyor 20 includes a pair of rolls, specifically an input roll 34 and an output roll 36, both of which rolls extend across the width of the applicator 12. Wound around the rolls 34 and 36 are a pair of spaced endless chains 38 and 40 with the spacing being such that one chain 38 is on one side of applicator 12 and the other chain 40 is on the other side thereof. Chain 38 meshes with a gear 42 provided on the end of input roll 34 and a gear 44 provided on the end of the output roll 36, as shown in FIG. 2. Similarly, chain 40 meshes with gears provided on the other ends of the input roll 34 and the output roll 36. Thus, as shown in FIG. 3 chain 40 meshes with a gear 46 on the end of the output roll 36.

Positioned between the chains 38 and 40 is a sectioned belt 48 under tension for movement of a printed circuit board into and out of the vacuum laminator. The sectioned belt 48, as shown in FIG. 2, is divided into two sections, specifically a first belt section 50 and a second belt section 52. Each belt section is securely attached to the chains at each end by a suitable gripper 54, as illustrated in FIG. 3, and extends about one quarter of the distance around the loop formed by the chains 38 and 40. The gripper 54 at each end of each belt section 50 and 52 includes a bar 56 that is securely attached at one end to the chain 38 and at the other end to the chain 40. Carried by bar 56 and securely attached thereto by suitable bolts or rivets are bar members 58 and 60 of shorter length between which the end of each belt section is captured and retained. As best seen in FIG. 2, dividing the belt 48 into its two respective belt sections 50 and 52 are two spaced apertures or openings 62 and 64 formed therein that extend for the full width thereof. The length of each aperture is about a quarter of the distance around the loop formed by the chains 38 and 40.

Each belt section 50 and 52 may be made of very thin glass fiber reinforced rubber or PTFE coated rubber. A total thickness of the belt in the range of 0.013 to 0.025 cm. is desirable to ensure that there is a complete seal when drawing a vacuum in the vacuum laminator 18. This is for the reason that the upper run of each belt section when in the vacuum chamber region is captured between upper and lower platens of the vacuum laminator 18 during the vacuum lamination process.

Motive power for driving the chain coupled rolls of the input conveyor 14 and the lower belt conveyor 20 is provided by an electrical motor 66. Motor 66 may comprise a direct current electrical motor and is provided with separate drive gears 68 and 70 for driving the input conveyor 14 and the belt conveyor 20, respectively.

As shown in FIG. 2, motor 66 is coupled by gear 68 and chain drive gearing 72 to input conveyor 14. Motor 66 is also coupled by gear 70 and chain drive gearing 74 and 76 to the drive shaft of the output roll 36 of the lower belt conveyor 20. An electromagnetic clutch 78 positioned between chain drive gearing 74 and 76 provides for the selective or conjoint drive of the input conveyor 14 and the lower belt conveyor 20.

The motor 66 is a variable speed motor, being selectively energizable from a source of direct current (not shown) through motor speed control potentiometers 80 and 82 and a selector switch 84, as shown in FIG. 1, to drive the input conveyor 14 at a speed of about three (3) meters/minute (m/min), and to drive the input conveyor 14 and the lower belt conveyor 20 at a speed of about nine (9) m/min, as further described hereinafter. The arrangement is such that the input conveyor 14 can be driven independently of or conjointly with the lower belt conveyor 20. Similarly, the lower belt conveyor 20 can be driven independently of the input conveyor 14. At no time, however, when driven at the same time, can the speeds of the conveyors 14 and 20 be different.

For the purpose of enabling the tension of the sectioned belt 48 of the lower belt conveyor 20 to be relieved at a desired point in the vacuum process, as shown in FIG. 2, a bearing 86 in which the shaft of the input roll 34 of the belt conveyor 20 is mounted for rotation is arranged to be shifted a short distance toward and away from the vacuum laminator 18 by a two-position air cylinder 88.

For sensing when a prelaminated printed circuit board has been moved by the lower belt conveyor 20 to a proper position relative to the vacuum laminator 18 for the vacuum lamination process to proceed, there is provided by each belt section 50 and 52, as best seen in FIG. 2, a cam 90 and a cooperating sensor 92. Cam 90 is mounted on and moves with the endless chain 38 around the loop of the belt conveyor 20. Sensor 92 is mounted in any suitable manner on the frame 10 of the applicator 12.

When the printed circuit board travelling on one of the lower belt sections 50 or 52 is moved in the proper position relative to the vacuum laminator 18 for the vacuum lamination process to proceed, one of the apertures 62 or 64 in the lower belt conveyor 20 is positioned immediately, that is, vertically, below the vacuum laminator, as best seen in FIG. 2. This allows the lower platen 94 of the vacuum laminator to be lifted up through the aperture into cooperative relation with the upper platen 96 of the vacuum laminator 18 for effecting the vacuum lamination of a printed circuit board then resting one of the lower belt sections 50 or 52 within the confines of the vacuum laminator 18, while the other of the lower belt sections remains outside of the vacuum laminator for cooling between vacuum lamination cycles.

Also, as shown on FIG. 2, an infrared sensor 98 is provided for sensing the temperature of the processed printed circuit board or substrate as it is conveyed out of the laminator 18. The temperature of the processed printed circuit board or substrate, as sensed by sensor 98 and indicated or displayed by suitable means, facilitates control of the heating means in the vacuum laminator 18 thereby to preclude overheating thereof and possible damage to the printed circuit board or substrate being vacuum laminated.

Since the sheets of dry film applied to the prelaminated printed circuit boards being vacuum laminated have high flow characteristics in the temperature range of 30° C. to 150° C., the vacuum lamination process may be carried out within this range.

Further, as illustrated in FIG. 2, the upper belt conveyor 22 is spaced above the lower belt conveyor 20 and extends through the vacuum chamber region of the vacuum laminator 18 between the upper and lower platens. The upper belt conveyor 22 includes a pair of take-up rolls, specifically an input take-up roll 100 and an output take-up roll 102, both of which rolls extend across the width of the applicator 12. Mounted adjacent to each take-up roll 100 and 102 is a cooperating guide roll 104 and 106, respectively, as well. Wound around the take-up rolls and secured thereto by suitable means (not shown) is an endless belt 108 that extends across the width of the take-up rolls.

The upper belt 108 may be made of very thin fiberglass reinforced rubber or Teflon coated fiberglass. A total thickness of the belt in the range of 0.013 to 0.025 cm. is desirable to ensure that there is a complete seal when drawing a vacuum in the vacuum laminator 18. This is for the reason that the upper run of the belt 108 is captured between the upper and lower platens of the vacuum laminator 18 during the vacuum lamination process.

The belt 120 is also provided of sufficient length to enable one section of the belt to be in the vacuum chamber region of the vacuum laminator 18 between the upper and lower platens while at least one other section of the belt 108 remains outside of said vacuum chamber region for cooling in between vacuum lamination cycles.

Motive power for driving the take-up rolls 100 and 102 is provided by one forward and one reverse motion electrical motor 110 and 112 which enable the belt 108 to travel in both forward and reverse directions for indexing selective portions of the belt incrementally into and out of the vacuum chamber region of the vacuum laminator 18. Each motor may comprise a constant speed direct current electrical motor which is selectively energizable from a source of direct current (not shown) to drive the take-up rolls 100 and 102 at a speed of about nine (9) m/min in the desired direction and for the desired increment.

Figure 4:
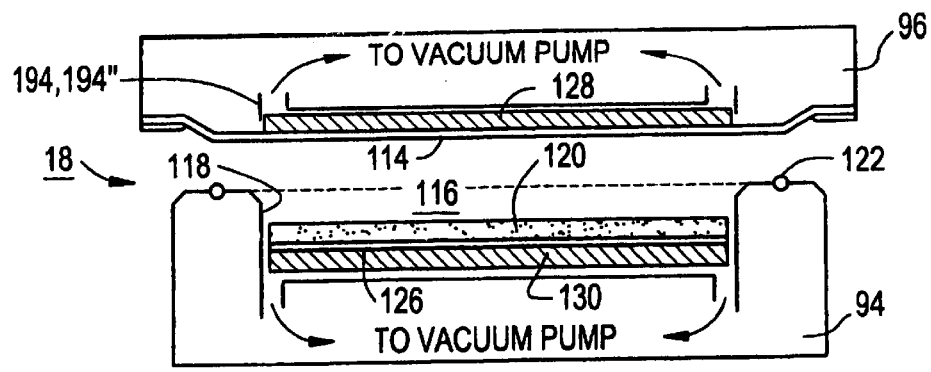

A vacuum laminator 18 that advantageously may be used in the conveyorized vacuum applicator 12 of the present invention is illustrated in FIGS. 4–7. Referring to FIG. 4, the laminator 18 includes a lower movable platen 94 and an upper stationary platen 96. Associated with the upper platen 96 is a resilient silicon rubber blanket 114 at forms a ceiling for the vacuum chamber region indicated at 116. The lower platen 94 has a well 118 into which a prelaminated printed circuit board or substrate to be vacuum laminated is positioned on a silicon rubber insert 120 for vacuum lamination. Sealing means 122 in the form of an O-ring surrounding the circumference of the lower platen 94 is provided for hermetically sealing the well 118 for the evacuation of air therefrom by a vacuum pump 124 when the lower platen 94 is moved upward into contact with the upper platen 96. One or more shim inserts 126 may be provided, as shown in FIG. 4, to accommodate printed circuit boards of different thicknesses, that is, for adjusting the printed circuit boards to an optimum position in the well 118 for best vacuum lamination operation. Both platens 94 and 96 include heaters, specifically a heater 128 in the upper platen 96 and a heater 130 in the lower platen 94.

Figure 5:
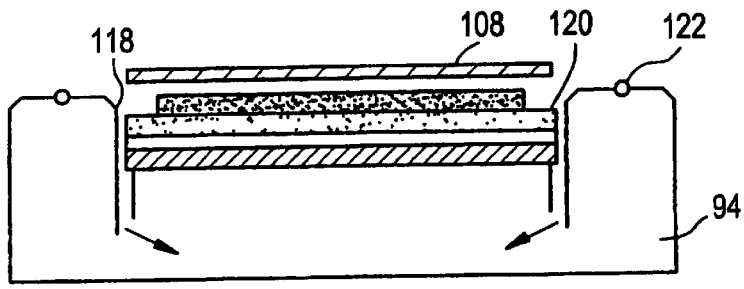

Printed circuit boards that have been prelaminated, that is, have had dry film photoresist or solder mask previously loosely applied to one or both sides thereof, as described hereinbefore, are vacuum laminated in the vacuum laminator 18 in the following sequence:

(1) The board to be vacuum laminated is placed in the well 118 of the lower platen 94 on top of the silicon rubber insert 120. This is facilitated by relieving the tension on the sectioned belt 48 of the lower belt conveyor 20 on the surface of which the board has been conveyed to the region of the vacuum chamber 116. The belt 108 of the upper belt conveyor 22 is also positioned directly overhead of the board in the vacuum chamber as shown in FIG. 5.

Figure 6:
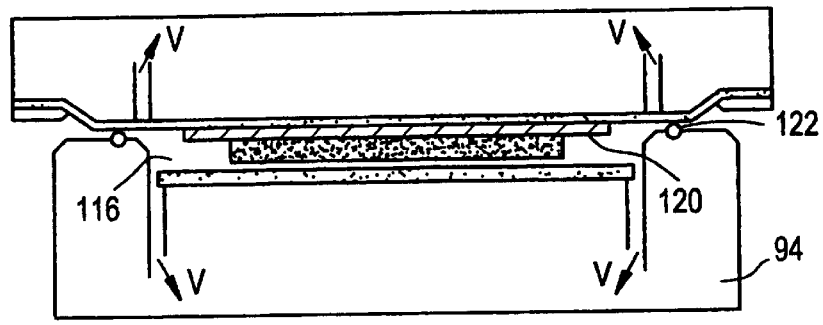

(2) The lower platen 94 is moved upward, as shown in FIG. 6, to seal, by means of the O-ring 122, the well 118 which together with the blanket 114 forms the vacuum chamber 1116. Note that the one of the belt sections 50 or 52 of the lower belt conveyor 20 on which the board being vacuum laminated rests along with a section of the belt 108 of the upper belt conveyor 22 are also captured between the upper platen 96 and the lower platen 94.

(3) The vacuum process cycle is started by the energization of the vacuum pump 124 thereby to evacuate air from the vacuum chamber 116 and from the region between the upper platen 96 and the blanket 114.

Figure 7:
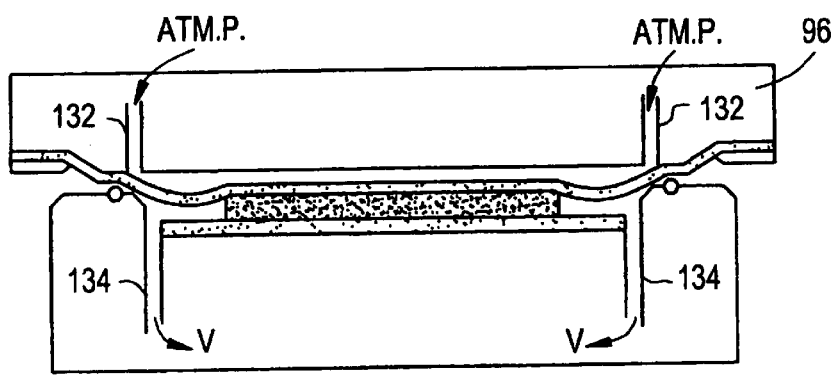

(4) For a set period at the end of a first stage of the vacuum process, there is a second stage or "slap down" of the blanket 114 in the upper platen 96, as shown in FIG. 7. This is effected by opening channels 132 in the upper platen 96 to allow atmospheric air or compressed air (e.g. 1 to 5 bars) to enter the space between the blanket 114 and the upper platen 96. Such slap down applies mechanical pressure on the printed circuit board to force the heated photoresist or solder mask film to conform around the raised electrical circuit traces and surface contours.

(5) When the cycle is complete, the vacuum in the vacuum chamber 116 is released by allowing atmospheric air to enter therein through channels 134 in the lower platen 94 whereupon the lower platen 94 may be moved downward out of contact with the upper platen 96.

It is noted that, in accord with the invention, the prelaminated boards to be vacuum laminated by the conveyorized vacuum applicator 12 will have been centered by preceding equipment in the in-line system, although, if desired, adjustable guides (not shown) may be provided for that purpose in association with the input conveyor 14.

The function cycle of the conveyorized vacuum applicator 12 with one board at a time being vacuum laminated is illustrated by FIGS. 8–13.

Figure 8:
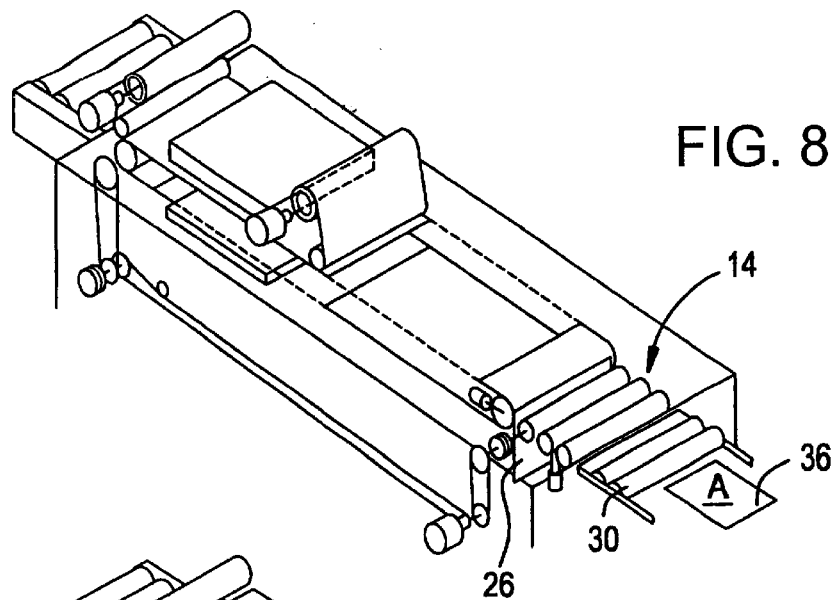

In step 1 of the sequence, as shown in FIG. 8, a prelaminated circuit board 136 is shown arriving on the input conveyor 14 from preceding equipment 30 running at a speed of 3 m/min. The adjustable barrier 26 is in the "up" board blocking position.

Figure 9:
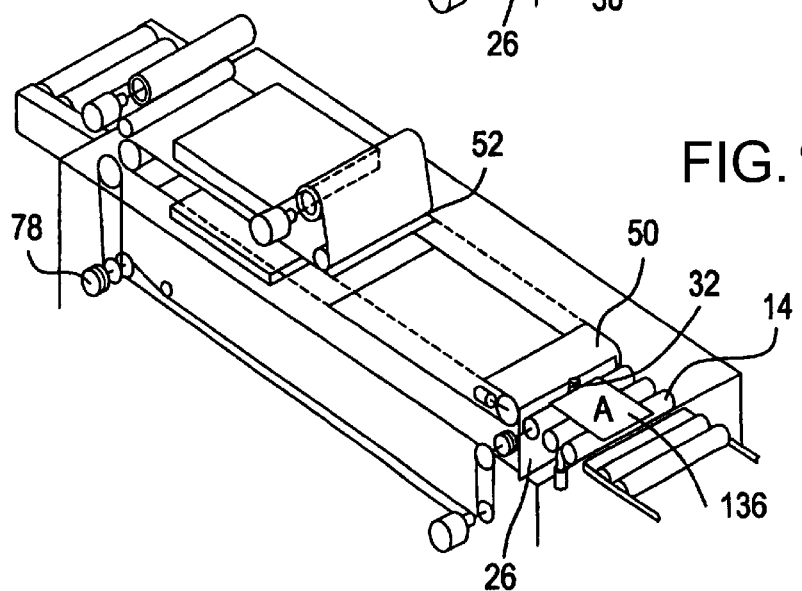

In step 2 of the sequence, as shown in FIG. 9, the board 136 is stopped by barrier 26 and is moved into alignment therewith, that is, squared up with respect thereto. As noted hereinbefore, the board 136 already has been centered on the input conveyor 14, having been centered by preceding equipment or by adjustable guides (not shown) associated with the conveyor 14. The conveyor 14 is stopped, as by actuation of electromagnetic clutch 78 as soon as the board 136 is sensed at the exit end thereof by the photocell 32.

Figure 10:
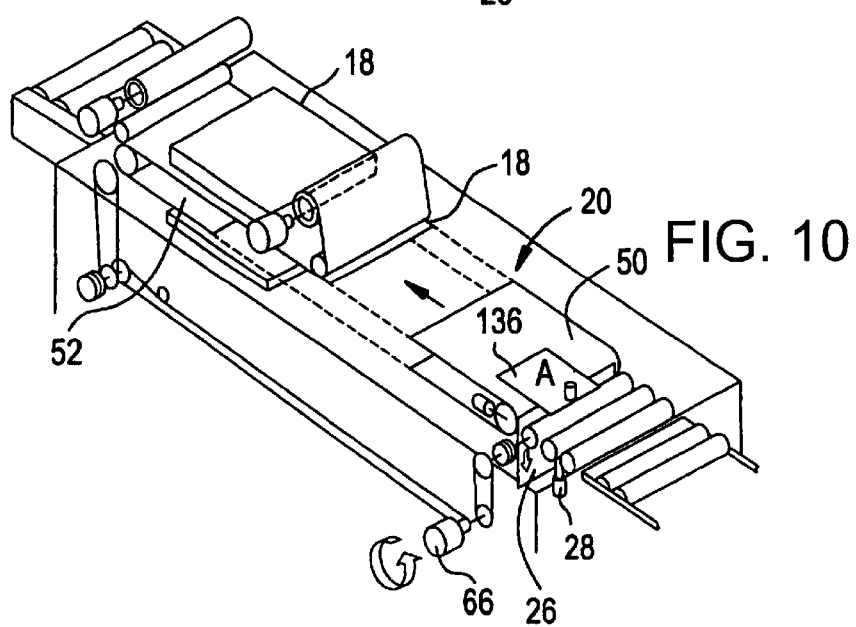

As controlled by a programmable logic controller (PLC) indicated schematically by the reference numeral 138 in FIG. 2, the barrier 26 is actuated downwardly, by actuation of air cylinder 28 in step 3 of the sequence, as shown in FIG. 10, to release the board 136. Immediately thereafter the input conveyor 14 and the lower belt conveyor 20 are both started by appropriate energization of the direct current motor 66 for operation at a speed of 9 m/min to load the board 136 onto one of the lower belt section 50 of the belt conveyor 20 and thereby into vacuum chamber 116 of the vacuum laminator 18 between the upper and lower platens.

Figure 11:
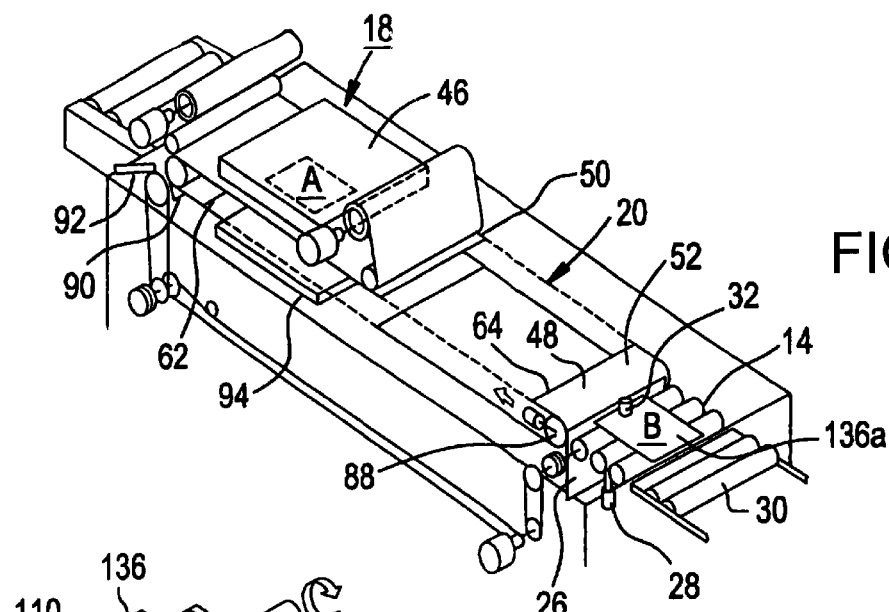

In step 4 of the sequence, as seen in FIG. 11, the cam 90 and cooperating sensor 92 provide a signal to stop the belt conveyor 20 and the input conveyor 14 when the board 136 is in the vacuum chamber 116 at a position directly vertically above the well 118 in the lower platen 94. The barrier 26 is moved up by actuation of air cylinder 28 and the input roll 34 of the belt conveyor 20 is shifted by the actuation of the two-position air cylinder 88 in the direction of the vacuum chamber 116 in order to release the tension of the sectioned belt 48 of the lower belt conveyor 20. In the meantime, the input conveyor 14 starts to run at a speed of 3 m/min while the lower belt conveyor 20 remains stationary to receive a new prelaminated printed circuit board 136a to be vacuum laminated. The new board 136a arrives from the preceding equipment 30 and stops at the barrier 26 which is in the up position and makes alignment therewith. The input conveyor 14 is then stopped as soon as the new board is sensed by the photocell 32. Meanwhile, the lower platen 94 of the vacuum laminator 18 is moved vertically upward by a pneumatic ram (not shown). The lower platen passes upward through one of the apertures 62 in the lower belt conveyor, which aperture is then in vertical alignment with the lower platen 94. Vacuum pump 124 is actuated for a predetermined time in a first vacuum stage of the vacuum process, after which, for a set period, a slap down action, as described in connection with FIG. 7, is applied. During the vacuum phase the board 136 is heated by the heaters 128 and 130 of the upper and lower platens, respectively.

Figure 12:
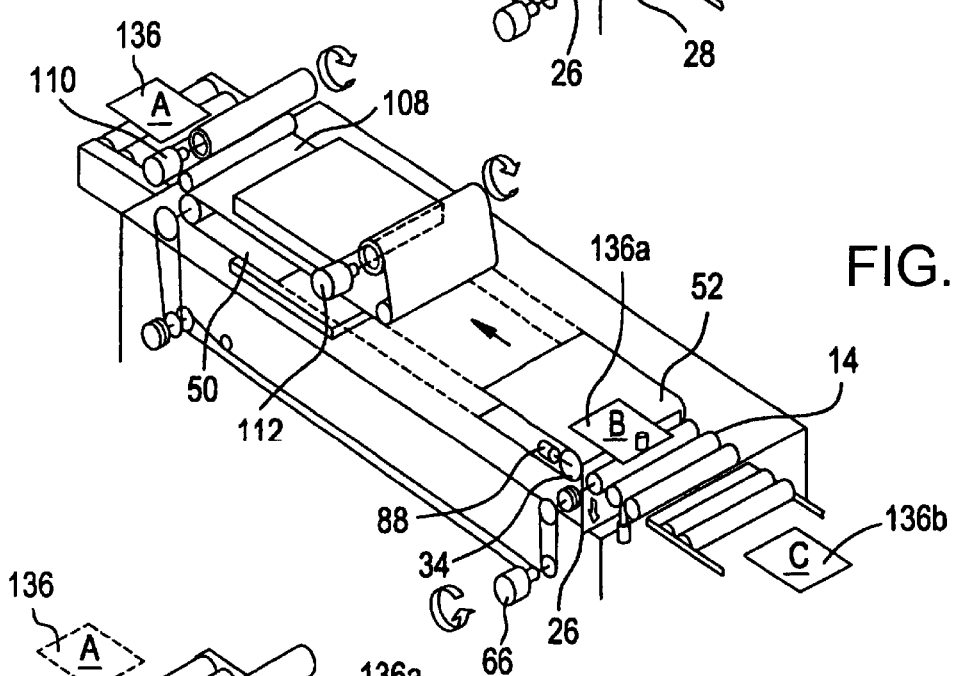

Step 5 of the sequence is shown in FIG. 12. This is after the vacuum lamination process has been completed. The vacuum in the vacuum chamber 116 is released by actuating a valve to allow the introduction of atmospheric air into the vacuum chamber. The lower platen 94 is then lowered by the pneumatic ram down through the aligned aperture 62 in the lower belt conveyor 20. The input roll 34 of the lower belt conveyor 20 is then moved back toward the exit end of input conveyor 14 by the two-position air cylinder 88 to restore the tension in the belt of the lower belt conveyor 20 for movement of the processed board 136 out of the vacuum laminator 18. The barrier 26 is also moved down to load the new board 136a waiting in aligned position at the barrier 26 onto the lower belt conveyor 20. By energization of the motor 66 as controlled by the PLC, both the input conveyor 14 and lower belt conveyor 20 are started at a speed of 9 m/min to effect rapid unloading of the processed panel 136 by the hot section 50 of the lower belt-conveyor 20 and the new panel 136a is conveyed by the cold section 52 of the lower belt conveyor 20 into the vacuum chamber 116 of the vacuum laminator until the cam 90 and cooperating sensor 92 provide a signal to stop the belt conveyor 20. Meanwhile, energization of one of the upper belt motors 110 or 112 as controlled by the PLC causes the upper belt 108 to move in a forward or reverse direction by one increment to make available a cold section for the new board 136a arriving in the vacuum chamber on the cold belt section 52. As the aforesaid occurs, a new prelaminated board 136b is arriving from the preceding equipment.

Figure 13:
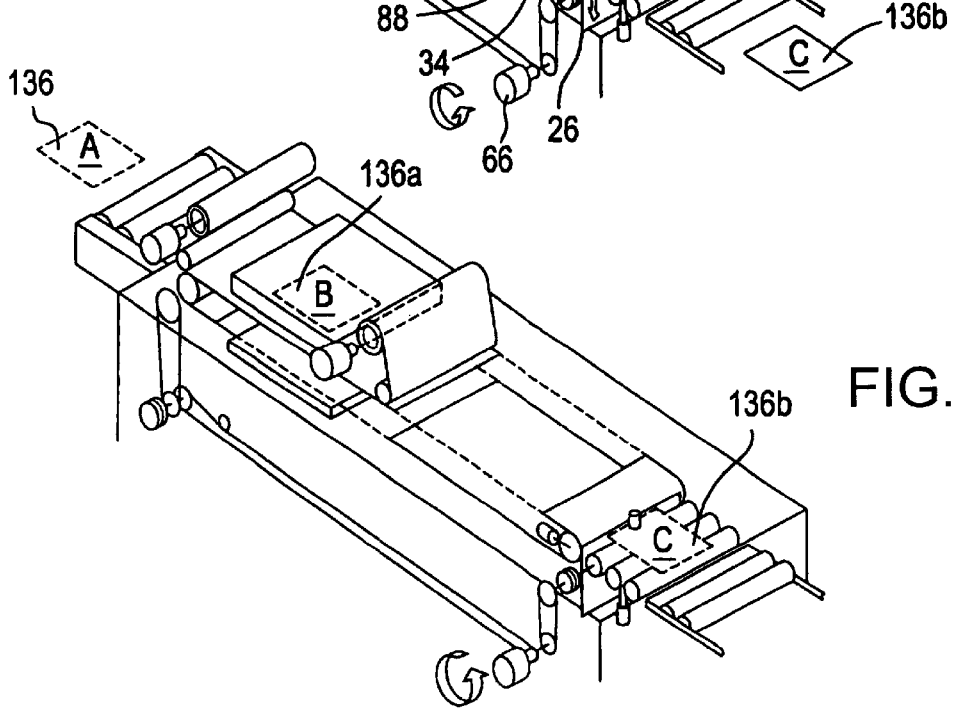

In step 6 of the sequence, as shown in FIG. 13, board 136a is introduced into the vacuum chamber. The vacuum lamination sequence is then started whereupon the upper and lower platens 96 and 94 close together and a vacuum is drawn in the vacuum chamber 116. The upper and lower belt conveyor sections now in the chamber are relatively cold at the start of the lamination process, and, accordingly, they act as insulating shields to prevent premature dry film adhesion to the board prior to completion of film evacuation. Meanwhile, the new board 136b stops at the barrier and makes alignment therewith. The cycle restarts from step 5 as illustrated in FIG. 12.

The sensing switches comprising cam 90 and sensor 92 may be of the type known in the art as proximity switches, a non-contacting switch. More specifically, the cam may comprise a metallic object with the sensor, in each case, comprising an electronic device which is fixed in position and is responsive to the movement nearby of the metallic cam and is operative to generate an electrical signal in response to movement and hence sensing of the metallic object.

The programmable logic controller 138 utilized to control the sequential operation of the conveyorized vacuum applicator 12 for vacuum laminating one prelaminated board at a time or two prelaminated boards at a time may be a microprocessor controller of a type available commercially from Saia, Mitsubishi or others. The controller 138 responds to the various signals produced by the photocell 32 and by the proximity switch sensor 92 to initiate, in concert with preprogrammed control data the several ensuing control functions including timing of the vacuum process laminating stages. These control functions include the actuation in the proper sequence of the air cylinders 28 and 88, the pneumatic ram for the lower platen, the electromagnetic clutch 78, the selector switch 84 for motor speed control, and the motors 66, 110 and 112. For convenience of illustration, in FIG. 2 the control paths between the PLC 138 and the several control devices just mentioned have been shown in dotted lines. It will be understood that, although not shown, the dotted lines include, where necessary and appropriate, as well known to those skilled in the art, conversion devices such as electrically operated pneumatic valves to control the various air cylinders and the pneumatic ram, and electrical relay means to control the motor speed control selector switch. Furthermore, the electrical circuit connections to the several input terminals (not shown) of the PLC 138 from the photocell 32 and from the sensor 92 have not been shown in order to avoid complication of the drawing since such circuitry is also well known and understood by those skilled in the art.

What is claimed is:

1. An automatic converyorized apparatus (12) for vacuum laminating a dry film photoresist-forming layer onto a prelaminated printed circuit board (136) which prevents premature tacking of the dry film to the board, comprising:

a vacuum laminator (18) having a vacuum chamber region (16) for application of heat, vacuum, and mechanical pressure to a prelaminated board placed therein;

a lower belt conveyor (20) operatively positioned for movement of the prelaminated board into and out of the region of the vacuum chamber, said lower belt conveyor including an endless belt (48) having two distinct sections (50,52) upon which the board can be placed, the two sections being so positioned such that, when one section of the lower belt is moved into the vacuum chamber region, the other section is moved out of said region and vice versa;

an upper belt conveyor (22) spaced above said lower belt conveyor, said upper belt conveyor including a belt (108) having at least two distinct sections that alternate into and out of the vacuum chamber region of said vacuum laminator such that, when one section of the upper belt is moved into the vacuum chamber region, at least one other section is moved out of said region and vice versa; and a controller (138) for controlling the movement of the upper and lower belts such that, as one section of the lower belt upon which the board to be vacuum laminated placed is moved into the vacuum chamber region of the vacuum laminator, one section of the upper belt is moved into the vacuum chamber region, and the other sections of the lower and upper belts are moved out of the vacuum chamber for cooling and vice versa.

2. Apparatus according to claim 1 wherein said vacuum laminator (18) has a relatively stationary upper platen (96) and a lower platen (94) that is adapted to be moved up into sealing engagement with said upper platen to form a vacuum chamber (16);

wherein said lower belt conveyor has its endless belt (48) under tension with two apertures (62,64) therein that extend across the width of the belt and divide the belt into said two distinct sections (50,52), the two apertures being so positioned such that, when the board is moved into the vacuum chamber region, one aperture is moved into said region into alignment with the lower platen, and the other aperture is moved out of said region and vice versa; and said apparatus further comprising:

a first motor (66) operative to cause one section of the belt of the lower belt conveyor (20) to move with a board placed thereon into position in the vacuum chamber region of said vacuum laminator and the other section to move out of the vacuum chamber region;

a second motor (110,112) operative to cause one section of the belt (108) of the upper belt conveyor (22) to index into the vacuum chamber region (16) and at least one other section thereof to index out of the vacuum chamber region;

a sensor (92) operative to sense the positioning of the board in the vacuum chamber region and provide a signal to stop the first motor (66) and movement of the belt (48) of the lower belt conveyor once the board is moved into proper position;

a tension adjuster (86,88) operative to relieve the tension of said belt of the lower conveyor after the board is moved into proper position in the vacuum chamber region;

a list operative to lift the lower platen up through the aperture in the belt of the lower belt conveyor into sealing engagement with the upper platen thereby to capture the board and at least a portion of the belt of the lower belt conveyor upon which the board is positioned and at leas a portion of the belt of the upper belt conveyor within the vacuum chamber; and;

a vacuum pump (124) to evacuate the vacuum chamber, said controller (138) being responsive to the signals provided by the sensor and operative to control said first and second motors (66,110,112), said upper and lower belt conveyors (22,20), said tension adjuster (86,88), said lift, and said vacuum pump (124).

3. Apparatus according to claim 2 further including:

a heater (128,130) controlled by said controller (138) for heating the upper platen (96) and the lower platen (94) of the vacuum laminator (18) to a temperature at which the laminate on the board (136) has a high flow characteristic.

4. Apparatus according to claim 3, further including an infrared sensor (98) at the exit of the vacuum chamber (16) for measuring the temperature of the laminated board exiting from the vacuum chamber and for providing a signal to cause the platen heaters (128,130) to increase or decrease the lamination temperature.

5. Apparatus according to claim 2, further including:

a mechanical press controlled by said controller (138) for causing the upper platin (96) of the vacuum chamber (16) to exert mechanical pressure on the board (136) to cause the dry film to completely conform to the surface of the board.

6. Apparatus according to claim 5 wherein the upper platen (96) of the vacuum chamber (16) includes a diaphragm (114) that is substantially impervious to air and forms the ceiling of the vacuum chamber, and further including:

a first passage communicating between said vacuum pump (124) and said vacuum chamber controlled by said controller (138) for evacuating said vacuum chamber;

a second passage (132) communicating between said vacuum pump and the space between said diaphragm and the upper platen (96) controlled by said controller for evacuating said space;

a third passage (134) communicating between the space between said diaphragm and the upper platen and air controlled by said controller at the end of a first stage of the vacuum lamination process to allow air at atmospheric pressure or compressed air to enter such space, before atmospheric air is allowed to enter the vacuum chamber, to cause the diaphragm to slap down and apply mechanical pressure on the board to force the laminate to conform closely to the surface contours of the board or substrate;

a fourth passage communicating between said vacuum chamber and atmospheric air controlled by said controller when the vacuum lamination process is complete allowing air at atmospheric pressure to enter the vacuum chamber;

said controller then being operative to actuate said lift to lower said lower platen (94) down through the aperture in the lower belt, to actuate said tension adjuster (86,88) to restore the tension of the belt (48), to actuate said first motor to move the processed board out of the region of the vacuum chamber and move the cool section of the lower belt into position and receive another prelaminated board, and to actuate said second motor to move one section of the upper belt out of the vacuum chamber region and a cool section of the upper belt into said region.

7. Apparatus according to claim 6, further including:

an input conveyor (14) arranged to sequentially feed prelaminated circuit boards (136) one at a time onto the lower belt conveyor (20).

8. Apparatus according to claim 7 wherein said input conveyor (14) is positioned in end-to-end relation with said vacuum laminator (18) and arranged to be driven under the control of said controller (138), the apparatus further including:

a movable barrier (26) at the exit end of said input conveyor, said barrier having a board blocking position and a board non-blocking position with said barrier initially being in the board blocking position; and a photocell (32) for sensing a prelaminated board (136) at the exit end of said input conveyor, said photocell producing a signal in response to the presence of a board to cause the controller to stop the movement of said input conveyor and to adjust said barrier to a non-blocking position, following which said controller causes the first motor to start both the input conveyor (140 and the lower belt conveyor (20) to load the board onto the entrance end of the lower belt conveyor.

9. Apparatus according to claim 1, wherein said dry film comprises a solder mask or a primary imaging resist.

10. The apparatus according to claim 1, wherein a thickness of the lower belt is from 0.013 to 0.025 cm.

11. The apparatus according to claim 1, wherein a thickness of the upper belt conveyor ranges from 0.013 to 0.025 cm.

* * * * *